United States Patent [19]

Ikeda et al.

[11] Patent Number: 5,198,755
[45] Date of Patent: Mar. 30, 1993

[54] PROBE APPARATUS

[75] Inventors: Towl Ikeda, Kofu; Teruo Iwata, Nirasaki; Issei Imahashi, Yamanashi, all of Japan

[73] Assignee: Tokyo Electron Limited, Tokyo, Japan

[21] Appl. No.: 753,078

[22] Filed: Aug. 30, 1991

[30] Foreign Application Priority Data

Sep. 3, 1990 [JP] Japan .................................. 2-232810
Sep. 3, 1990 [JP] Japan .................................. 2-232811

[51] Int. Cl.⁵ ............................................. G01R 1/04
[52] U.S. Cl. .............................. 324/158 P; 324/72.5; 324/158 F; 156/647
[58] Field of Search ............... 324/72.5, 158 P, 158 F; 357/26; 29/846; 156/647, 653, 659.1, 663, 623 Q

[56] References Cited

U.S. PATENT DOCUMENTS

| | | | |
|---|---|---|---|
| 4,055,805 | 10/1977 | Ardezzone | 324/158 P |
| 4,585,727 | 4/1986 | Reams | 324/158 P |
| 4,585,991 | 4/1986 | Reid et al. | 156/647 |
| 4,824,073 | 4/1989 | Zdeblick | 357/26 |
| 4,827,211 | 5/1989 | Strid et al. | 324/158 F |
| 4,867,842 | 9/1989 | Bohrer et al. | 156/647 |
| 4,895,705 | 1/1990 | Wrighton et al. | 324/663 |
| 4,943,719 | 7/1990 | Akamine et al. | 73/105 |
| 4,983,908 | 1/1991 | Tada et al. | 324/72.5 |
| 4,998,062 | 3/1991 | Ikeda | 324/158 P |
| 5,020,219 | 6/1991 | Leedy | 324/158 P |
| 5,026,437 | 6/1991 | Neukermans et al. | 156/653 |
| 5,041,783 | 8/1991 | Ohta et al. | 324/158 D |

Primary Examiner—Ernest F. Karlsen
Assistant Examiner—William J. Burns
Attorney, Agent, or Firm—Oblon, Spivak, McClelland, Maier & Neustadt

[57] ABSTRACT

A probe apparatus has a quartz probe formed of a quartz probe body and a metallic pattern layer formed thereon, the quartz probe body including a plurality of probe portions having a large number of probes corresponding to an electrode array of an object of examination, lead pattern portions continuous individually with the probe portions, and a supporting portion supporting all the lead pattern portions, the quartz probe body being designed so that the longitudinal direction of each probe is inclined with respect to a crystal axis X or Y of a quartz plate by etching a Z plane of the quartz plate perpendicular to a crystal axis Z of the quartz plate, and a tester fitted with the quartz probe by means of an adapter.

10 Claims, 7 Drawing Sheets

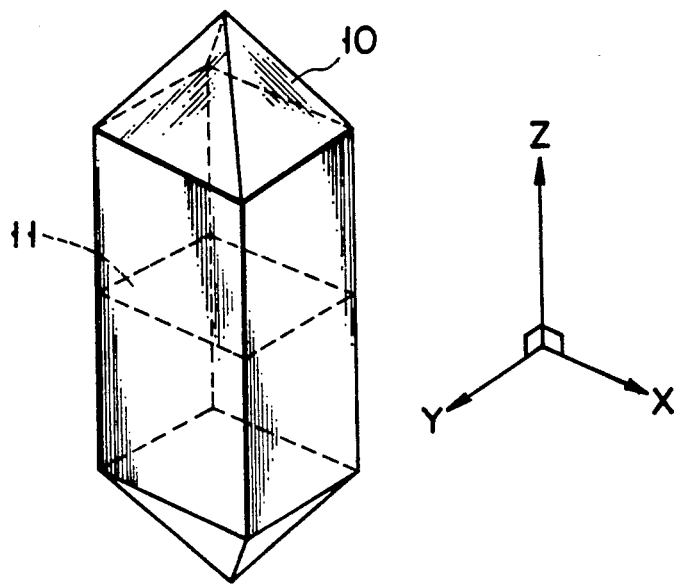
F I G. 1
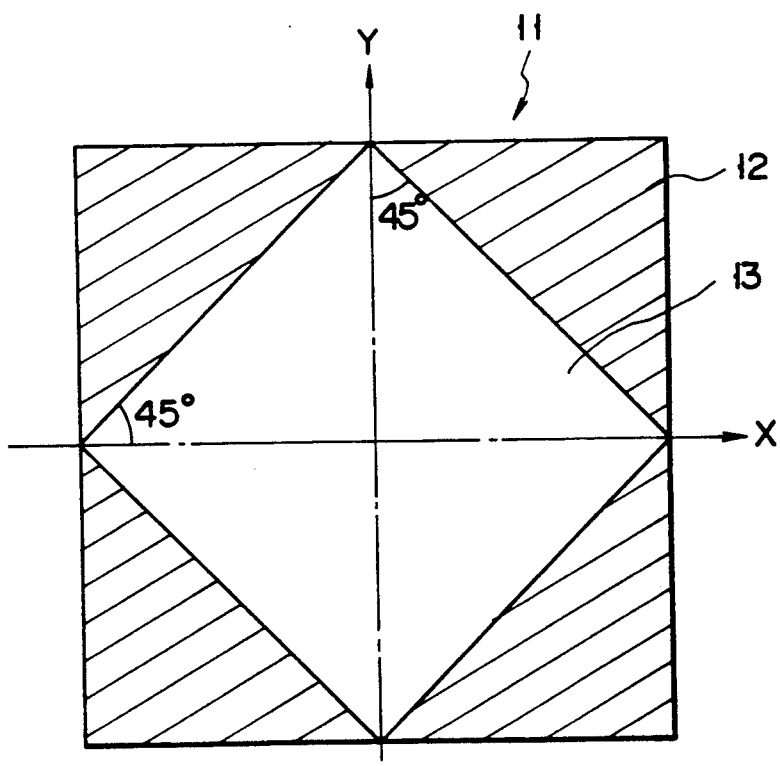
F I G. 2

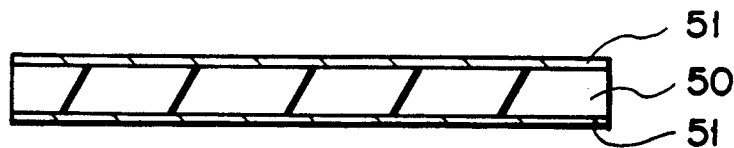
F I G. 5A
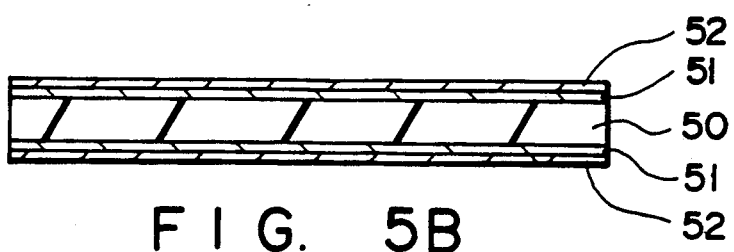
F I G. 5B
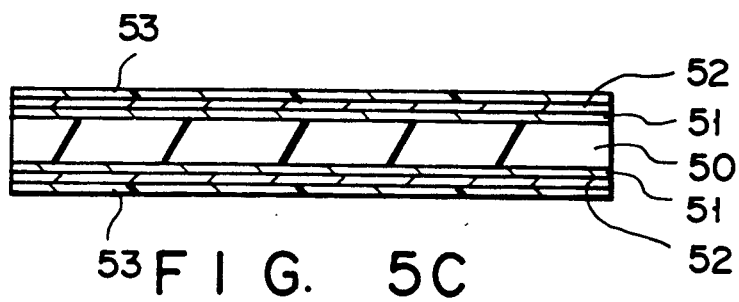
F I G. 5C
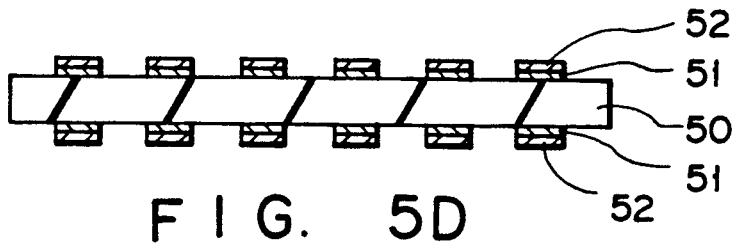
F I G. 5D
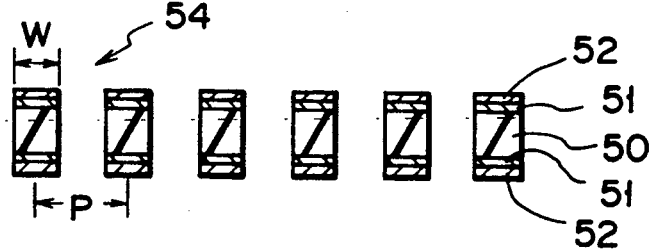
F I G. 5E
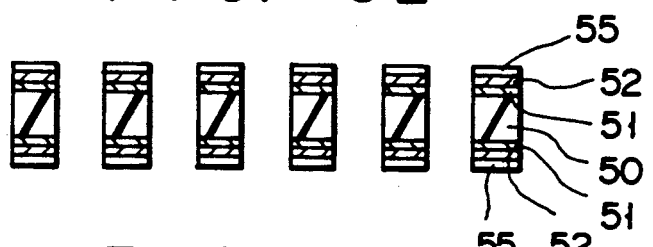
F I G. 5F

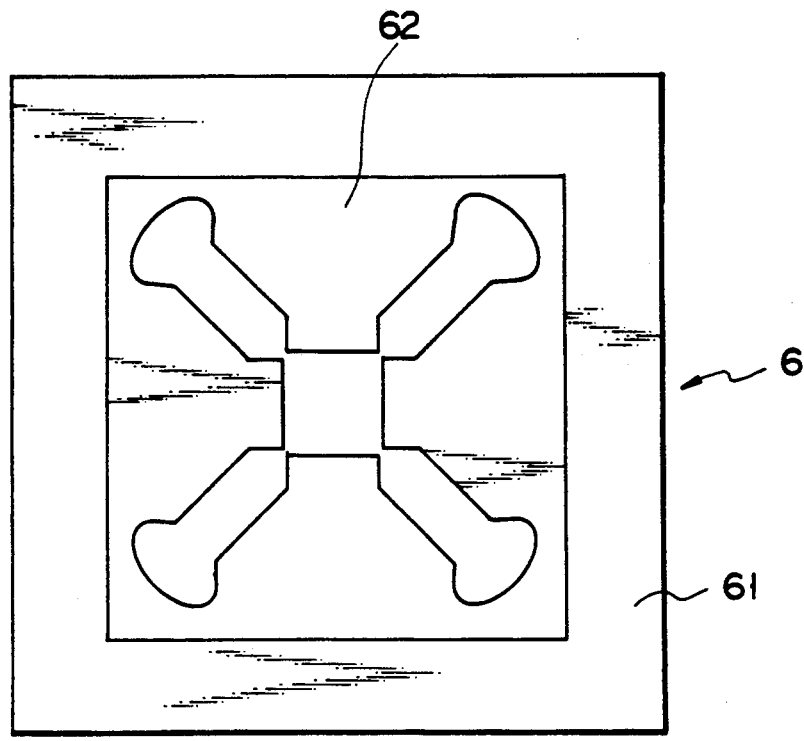
F I G. 6
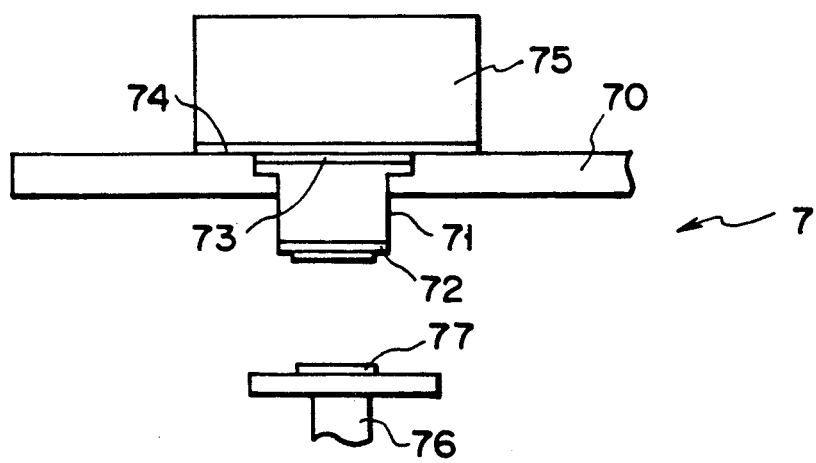
F I G. 7

PROBE APPARATUS

BACKGROUND OF THE INVENTION

1. Field of the Invention

The present invention relates to a probe apparatus, and more particularly, to a probe apparatus for examining the electrical properties of a semiconductor device having a large number of electrode pads, such as ICs.

2. Description of the Related Art

As the integration density of ICs increases to 4 M, 16 M, ..., the pitch between electrode pads of each IC chip becomes very narrow. With use of a conventional probe card stylus, it is hard to examine ICs whose electrode pads are arranged at pitches as narrow as 100 $\mu$m, for example. More specifically, it is difficult to examine an IC chip with narrow-pitch electrode pads by means of a conventional slice stylus, such as a tungsten stylus, whose tip end is limited in machining accuracy. Also, it is very difficult to manufacture a probe apparatus which can examine the IC chip by means of the slice stylus.

Thereupon, a method for manufacturing a quartz probe has been proposed (see Japanese Patent Application No. 1-22085). In this method, which uses the etching process as a typical IC manufacturing technique, quartz is used as the material of probes. This is a selective etching method which is based on the etching anisotropy of crystal axes, that is, the fact that the etching rate of the quartz varies with the directions of the crystal axes X (optical axis), Y (electrical axis), and Z (chemical axis) (X:Y:Z = 1:6 or less:100) According to this method, a quartz probe having a probe column pattern thereon is manufactured from a filmy quartz substrate.

In this method, the quartz is cut out along the direction perpendicular to its Z axis to produce a rectangular thin quartz plate 100 whose sides extend parallel to the X or Y axis, as shown in FIG. 10, for example. The quartz plate 100 is etched to form probe columns 103A, 103B, 103C and 103D which correspond to electrode pad columns 102A, 102B, 102C and 102D, respectively, formed individually along the four sides of an IC chip 101. In this case, the Y-axis direction is the longitudinal direction of the probe columns 103A and 103B, while the X-axis direction is the longitudinal direction of the probe columns 103C and 103D.

As a result of trial mass production of probe cards, however, it was indicated that electrical connection with the electrode pads sometimes may be unreliable during the examination according to the method described above. As mentioned before, the etching rate with respect to the X-axis direction is about six times as high as that with respect to the Y-direction. Although the probe columns 103A and 103B, whose longitudinal direction is an alignment with the Y-axis direction, are formed satisfactorily, therefore, the probe columns 103C and 103D, whose longitudinal direction is an alignment with the X-axis direction, are formed having undercut (side etching) portions 111 on the flank of each probe 110, as shown in FIG. 11. These undercut portions are as deep as about 6 $\mu$m. Since the individual probes tend to be made thinner and thinner, in order to increase the integration density of the ICs, the undercut is fatal to the probes.

SUMMARY OF THE INVENTION

The object of the present invention is to provide a probe apparatus arranged so that probes having a good probe effect can be obtained with a satisfactory yield.

The above object is achieved by a probe apparatus having a quartz probe body and a metallic pattern layer formed thereon, the quartz probe body including a plurality of probe portions having a large number of probes corresponding to an electrode array of an object of examination, lead pattern portions continuous individually with the probe portions, and a supporting portion supporting all the lead pattern portions, the quartz probe body being designed so that the longitudinal direction of each probe is inclined with respect to a crystal axis X or Y of a quartz plate by etching a Z plane of the quartz plate perpendicular to a crystal axis Z of the quartz plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing a crystal of quartz;

FIG. 2 is a plan view of a quartz plate used in the present invention;

FIGS. 5A to 5F are sectional views for illustrating processes for manufacturing the quartz probe of the invention;

FIG. 6 is a front view of a probe card using the quartz probe of the invention;

FIG. 7 is a front view of a tester fitted with the probe card shown in FIG. 6;

DETAILED DESCRIPTION OF THE PREFERRED EMBODIMENTS

Figure 3:
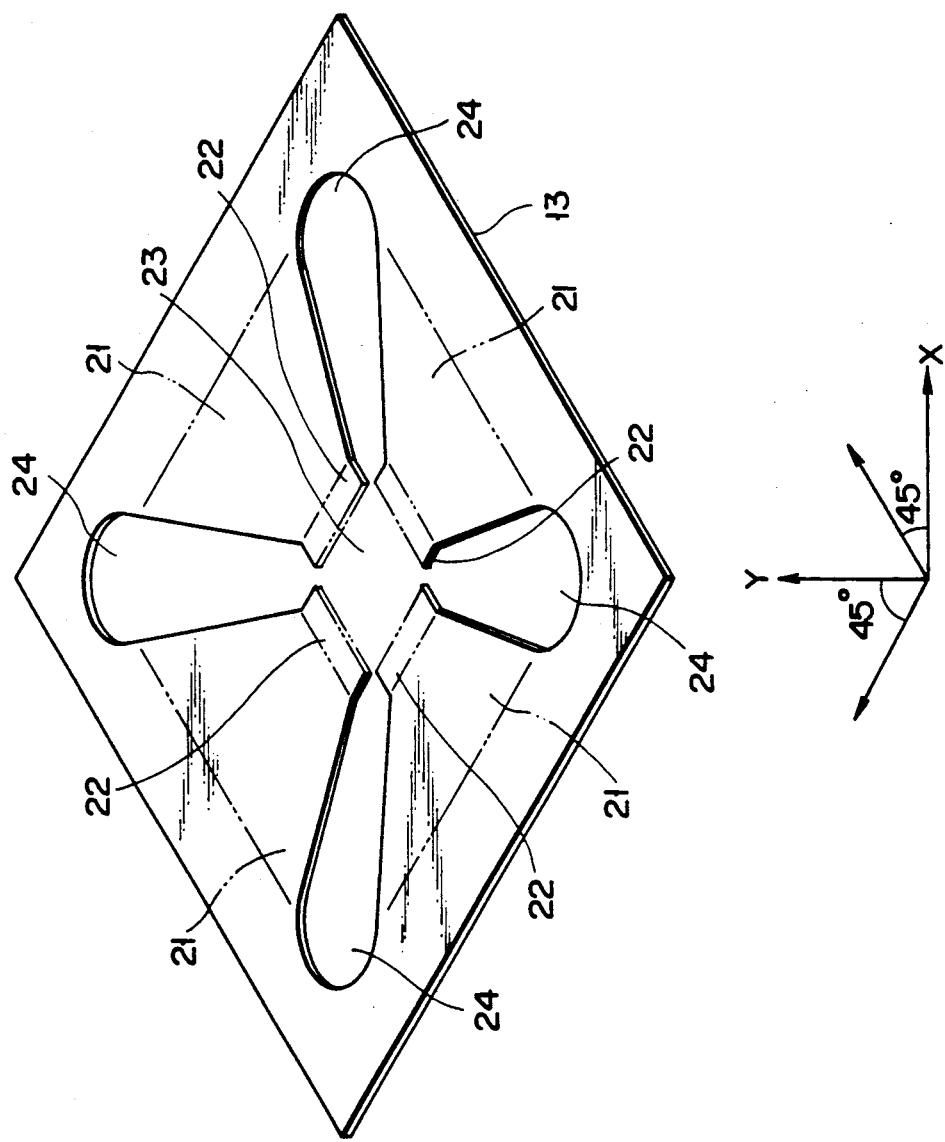
FIG. 3 is a perspective view showing an example of a probe body of a quartz probe of the invention.

A quartz probe according to the present invention will now be described with reference to the accompanying drawings.

In FIG. 1, numeral 10 designates a crystal of quartz, and the X axis (optical axis), Y axis (electrical axis), and Z axis (chemical axis) of the crystal are directed as illustrated. An X-Y plane (Z plane) defined by the crystal axes X and Y which intersect the crystal axis Z at right angles is an etching axis.

A square thin plate 11 is cut out vertically in the Z-axis direction from the quartz crystal 10 so that it contains an X-Y plane.

As shown in FIG. 2, four equilateral triangular portions 12 of the thin plate 11 are cut off to form a square quartz plate 13 whose sides are inclined at about 45° to the X- and Y-axis directions. Preferably, in this case, the thickness of the plate 13 ranges from about 30 to 150 μm. For example, the thin plate 11 may be cut out having a thickness of about 130 μm, and then polished or etched to a thickness of 100 μm.

Subsequently, the quartz plate 13 is etched to form a probe body with a desired shape, as shown in FIG. 3. The probe body includes four comb-shaped lead pattern portions 21 and probe columns 22 continuous with their corresponding pattern portions 21. The probe columns 22 are arranged corresponding to electrode pad columns which are located individually on, e.g., the fourth sides of an IC chip as an object of examination. A rectangular notch portion 23 is formed in the central portion of the quartz plate 13 so as to correspond to the IC chip. A notch portion 24 for bending is formed between each two adjacent lead pattern portions 21. In this case, the longitudinal direction of each probe column 22 is inclined at about 45° to the X- and Y-axis directions of the quartz crystal.

Figure 4:
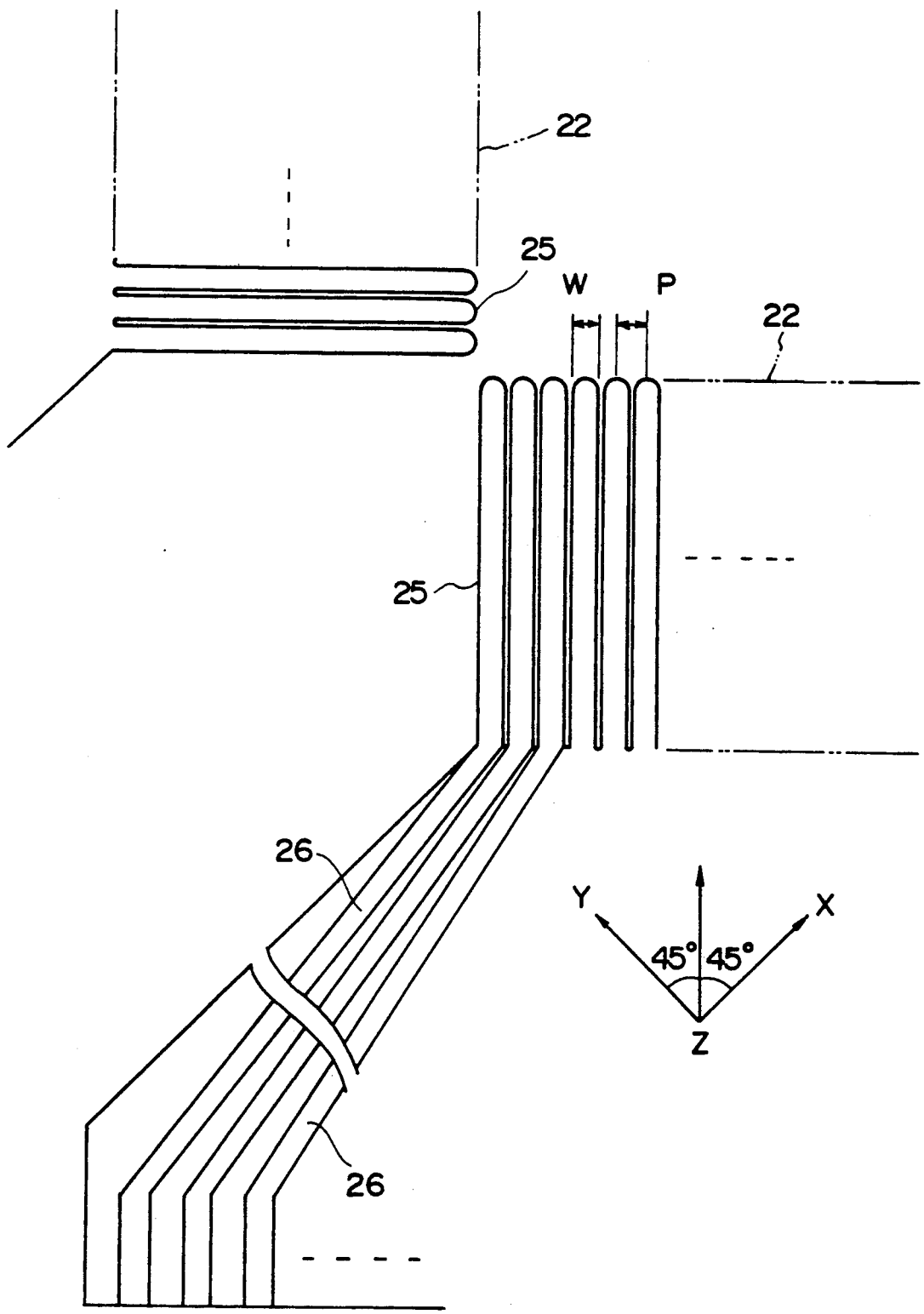
FIG. 4 is a partial enlarged view of the probe body shown in FIG. 3.

As shown in FIG. 4, each probe column 22 is composed of a large number of strip-shaped probes 25. The probes 25 formed on each side of the probe body are as many as electrode pads on each side of an IC (not shown) as an object of examination. The pitch P between the probes 25, which depends o the number of electrodes on each side of the IC, ranges from 30 to 100 μm. The width W of each probe 25 ranges from 20 to 80 μm. In the present embodiment, the probe width and pitch are 40 μm and 80 μm, respectively. In order to connect the probes 25 electrically to an external circuit, moreover, leads 26 are formed by gilding or the like, extending from the probes 25 to the lead pattern portions 21.

Since the quartz plate 13 is thus etched with predetermined angles with respect to the directions of the crystal axes X and Y, the four probe columns corresponding to the electrode pads on the four sides of the rectangular IC chip, for example, can be etched substantially uniformly. Accordingly, the four probe columns can be simultaneously integrally formed from one thin quartz plate without any undercut.

Referring now to FIGS. 5A to 5F, processes for manufacturing the quartz probe from the quartz plate 50 will be described specifically.

First, an electric conductor, such as chromium, is deposited on both sides of a square quartz plate 50 by, for example, sputtering, to form chromium layers 51 each having a thickness of, e.g., about 500 angstroms, as shown in FIG. 5A. Then, a good electric conductor, such as gold, is deposited on both the chromium layers 51 by, for example, sputtering, to form first gold layers 52 each having a thickness of, e.g., about 500 angstroms, as shown in FIG. 5B. Then, in a patterning process, a photosensitive material, such as a photoresist, is applied to the gold layers 52 on either side to form resist layers 53, as shown in FIG. 5C.

Subsequently, the resist layers 53 are exposed with use of a mask having a pattern corresponding to the probe body which is in conformity with the electrode pad pattern of the IC chip, and developed, as the object of examination shown in FIG. 3. Then, the first gold layers 52 and the chromium layers 51 are etched (e.g., by plasma etching) with use of the patterned resist layers 53 as masks, as shown in FIG. 5D. In this case, the width W and pitch P of a probe section 54 is 40 μm and 80 μm, respectively.

Then, the quartz plate 50 is etched (e.g., by plasma etching) by means of a 1:1 gas mixture of hydrofluoric acid or ammonium fluoride and hydrogen fluoride, with use of the first gold layers 52 and the chromium layers 51 as masks, at a temperature of 55° to 60° C., for example, as shown in FIG. 5E. In doing this, it is advisable to stir the gas by means of a stirrer. Thus, the probes are formed so that their longitudinal direction is inclined at about 45° to the X- and Y-axis directions, and they are separated from one another, as shown in FIG. 5E.

The speed of etching in the directions at about 45° to the X- and Y-axis directions was measured. As compared with 1 for the speed in the X-axis direction, the measured speed is 6 or more, which is higher than the etching speed ($=6$) in the Y-axis direction.

Since the quartz plate 50 is etched on both sides thereof, the side faces of each probe are subject to some undercut (side etching). The depth of this undercut was found to be about 3 μm, as compared with 6 μm for the conventional case where the Y-axis direction is the longitudinal direction of each probe.

Subsequently, the first gold layers 52 was further gilded so that second gold layers 55 are formed thereon, as shown in FIG. 5F. Thereafter, the lead pattern portions are bent.

More specifically, the four lead pattern portions 21 shown in FIG. 3 are inclined at an angle of 5° to 15° so that their probe side is depressed. The four probe columns 22 extend parallel to the horizontal plane of the peripheral portion of the quartz plate 13, and is situated below the same. The notch portion 24 for bending facilitates this bending work.

In this manner, the quartz probe according to the present invention is completed. Thereafter, a quartz probe 62 is mounted on a substrate 61 so that probes 60 can be in contact with the individual electrode pads on the four sides of the IC chip, as shown in FIG. 6, whereby a probe card 6 for VLSI is manufactured.

The probe card 6 is set in a tester 7 shown in FIG. 7 by means of an adapter. The tester 7 comprises a support 70, an insert ring 71 fitted in an opening of the support 70, a card socket 72 attached to the bottom face of the ring 71, a contact board 73 mounted so as to close the opening of the support 70, and a test head 75 having a performance board 74 on its bottom face. The probe card 6 is set in the card socket 72.

The tester 7 constructed in this manner is used to test a wafer 77 mounted on an adjusting table 76 which, having a fine adjustment mechanism for X, Y, Z, and θ directions, is located under the probe card 6.

Figure 8:
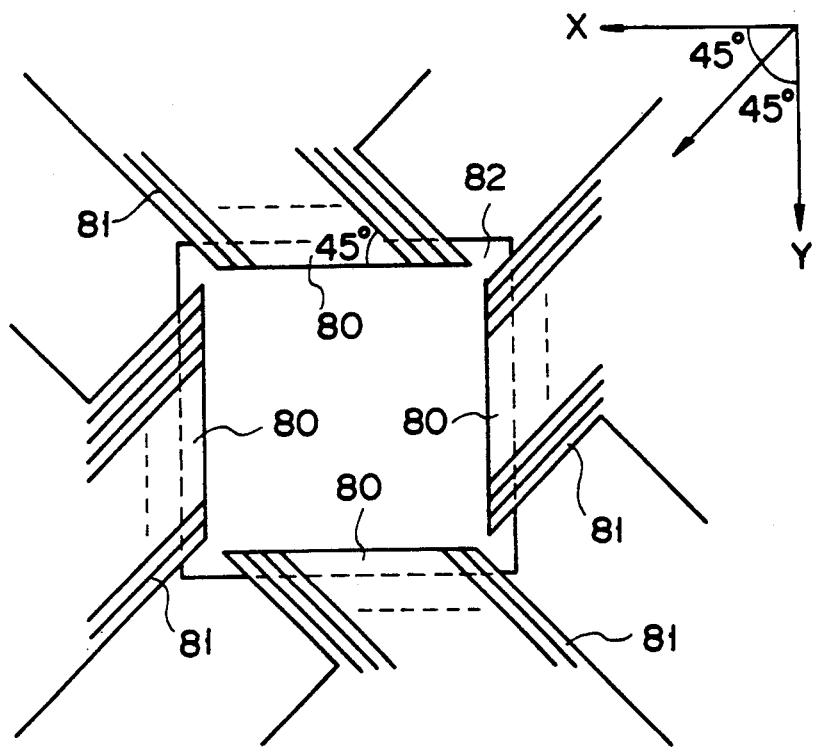
FIGS. 8 and 9 are schematic views showing alternative embodiments of the quartz probe of the invention.
Figure 9:
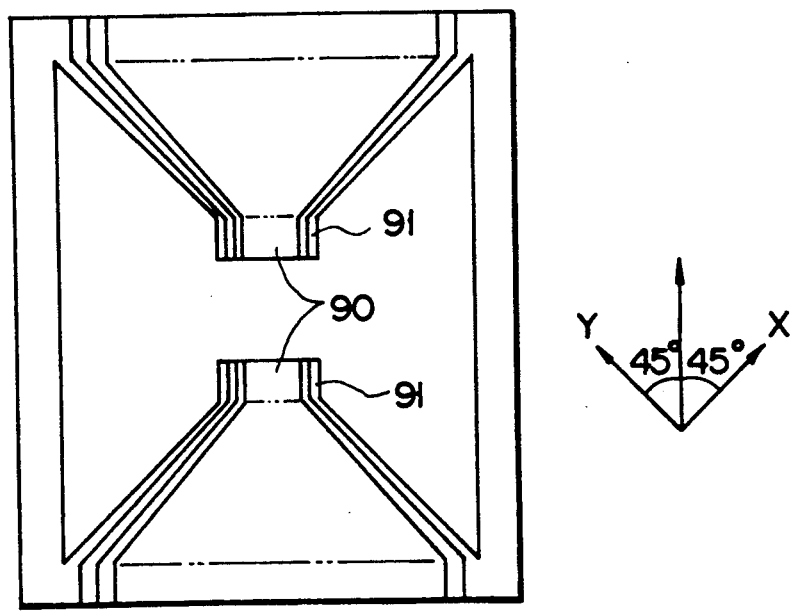
Figure 10:
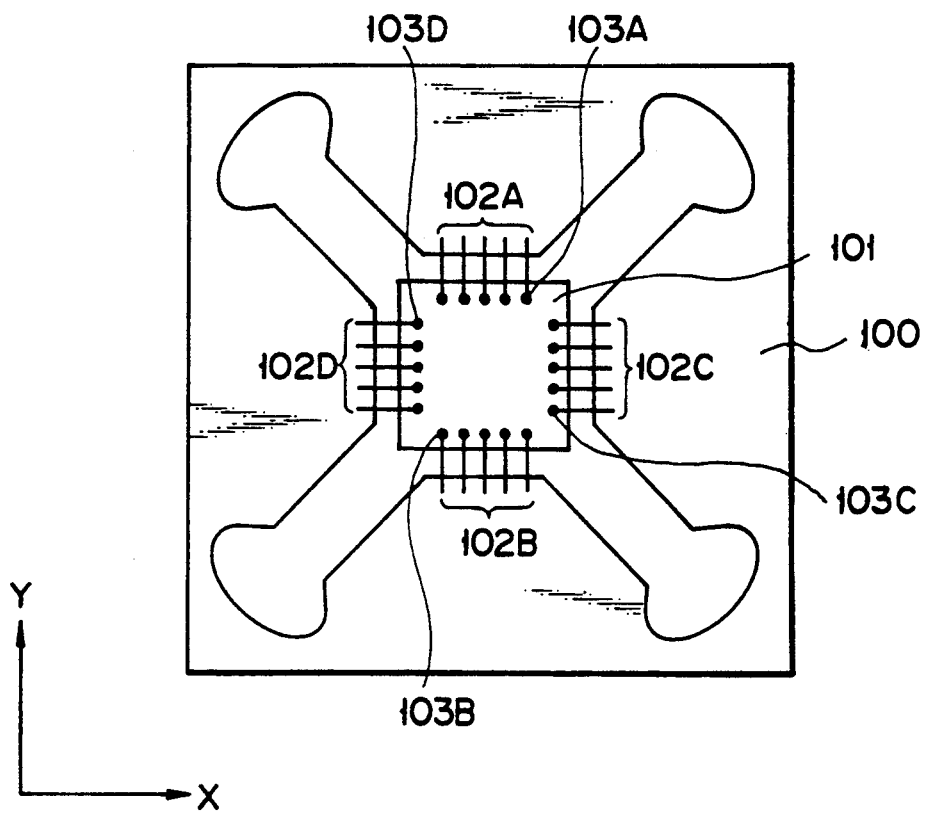
FIG. 10 is a schematic view of a conventional quartz probe.
Figure 11:
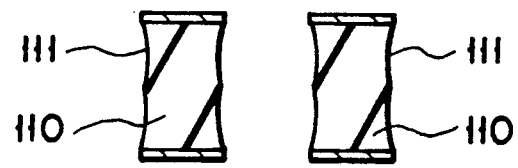
FIG. 11 is a sectional view showing profiles of microprobes of a conventional quartz probe.

In the present embodiment, the quartz plate is cut out in a manner such that its sides are inclined at about 45° to the X- and Y-axis directions, and that the longitudinal direction of each probe is perpendicular to each corresponding side of the IC chip. Alternatively, however, the quartz plate may be cut out in a manner such that its sides extend in the X- or Y-axis direction, and that the longitudinal direction of each of probes 81 of four probe columns 80 is inclined at about 45° to each corresponding side of an IC chip 82, and therefore, to the X- and Y-axis directions, as shown in FIG. 8, for example.

In the present embodiment, moreover, the quartz probe has the probe columns corresponding individually to the electrode pads on the four sides of the IC chip. The same effect may, however, be obtained with use of a quartz probe 91 which has probe columns 90 corresponding individually to electrode pads on only two sides of an IC chip. Also in this case, the two probe columns may be formed in a manner such that the longitudinal direction of each of their probes is inclined at about 45° to the two opposite sides of the IC chip, and therefore, to the X- and Y-axis directions.

In the present embodiment, the longitudinal direction of each probe is inclined at about 45° to the directions of the crystal axes X and Y of the quartz. This angle of inclination is not, however, limited to 45°, and may be set at about 30° to 60° with the same result.

In the present embodiment, furthermore, the quartz is etched after the conductor layers are formed on the quartz plate. Alternatively, however, the conductor layers may be formed after the quartz is etched.

According to the present invention, as described above, the Z plane of the quartz is etched so that the longitudinal direction of each probe is inclined with respect to the directions of the crystal axes X and Y of the quartz. Accordingly, the four probe columns to be brought into contact with the electrode pads on the individual sides of the rectangular IC can be formed substantially uniformly from one quartz at a time and with undercut much less than in the conventional case. Moreover, the etching speed is higher than the conventional one.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A quartz probe, comprising:
   a quartz probe body formed of an integral structure including at least two probe rows having a large number of probes corresponding to an electrode array of an object of examination, lead pattern portions respectively connected to said probe rows, and a supporting portion for supporting all the lead pattern portions; and
   a metal pattern layer formed on at least that portion of said quartz probe body which is brought into contact with the electrodes of said object;
   wherein the quartz probe body is formed by etching the Z plane perpendicular to a crystal axis Z of a quartz plate;
   said probe extends into a central opening formed by etching said quartz plate; and
   a longitudinal direction of each probe row is inclined relative to at least one of a crystal axis X and a crystal plate axis Y of the quartz.

2. The quartz probe according to claim 1, wherein the longitudinal direction of the probe row is inclined to make an angle of 30° to 60° with one of the crystal axes X and Y of the quartz plate.

3. The quartz probe according to claim 1, wherein the lead pattern portion is inclined at an angle of 5° to 15° from the supporting portion toward the object.

4. The quartz probe according to claim 1, wherein the probe row is formed to face the four sides of a rectangular object.

5. The quartz probe according to claim 3, wherein the probe body comprises inclined recesses serving to partition the lead pattern portion and communicating with the central opening.

6. The quartz probe according to claim 1, wherein the row of probes is inclined by 30° to 60° relative to a row of electrodes of the object.

7. A probe card, comprising:
   a quartz probe body formed of an integral structure including at least two probe rows having a large number of probes corresponding to an electrode array of an object of examination, lead pattern portions respectively connected to said probe rows, and a supporting portion for supporting all the lead pattern portions;
   a quartz probe formed of a metal pattern layer formed on at least that portion of said quartz probe body which is brought into contact with the electrodes of said object; and
   a mother board on which said quartz probe is disposed; wherein the quartz probe body is formed by etching a Z plane perpendicular to a crystal axis Z of a quartz plate;
   said probe extends into a central opening formed by etching said quartz plate; and
   a longitudinal direction of each probe row is inclined relative to at least one of a crystal axis X and a crystal axis Y of the quartz plate.

8. The probe card according to claim 7, wherein a longitudinal direction of the row of probes is inclined by 30° to 60° relative to at least one of the crystal axes X and Y of the quartz plate.

9. A probe device for measuring the electrical characteristics of a object, comprising:
   a quartz probe body formed of an integral structure including at least two probe rows having a large number of probes corresponding to an electrode array of an object of examination, lead pattern portions respectively connected to said probe rows, and a supporting portion for supporting all the lead pattern portions;
   a quartz probe formed of a metal pattern layer formed on at least that portion of said quartz probe body which is brought into contact with the electrodes of said object;
   a mother board on which said quartz probe is disposed;
   a tester electrically connected to said quartz probe;
   wherein the quartz probe body is formed by etching a Z plane perpendicular to a crystal axis Z of a quartz plate;
   said probe extends into a central opening formed by etching said quartz plate; and
   a longitudinal direction of each probe row is inclined relative to at least one of a crystal axis X and a crystal axis Y of the quartz plate.

10. The probe device according to claim 9, wherein the longitudinal direction of the row of probes is inclined by 30° to 60° relative to one of the crystal axes X and Y of the quartz plate.

* * * * *